US006222196B1

(12) United States Patent
Mack (10) Patent No.: US 6,222,196 B1
(45) Date of Patent: Apr. 24, 2001

(54) ROTATABLE WORKPIECE SUPPORT INCLUDING CYCLINDRICAL WORKPIECE SUPPORT SURFACES FOR AN ION BEAM IMPLANTER

(75) Inventor: Michael E. Mack, Manchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/197,083

(22) Filed: Nov. 19, 1998

(51) Int. Cl.$^7$ .......................... H01J 37/317; H01J 37/20; G21K 5/08
(52) U.S. Cl. ................................. 250/492.21; 250/492.2; 250/492.3; 250/398; 250/400; 250/440.11; 250/442.11
(58) Field of Search ............................ 250/492.21, 492.2, 250/492.3, 398, 400, 440.11, 442.11

(56) References Cited

U.S. PATENT DOCUMENTS

| 4,700,077 | * | 10/1987 | Dykstra et al. | 250/492.2 |
| 4,831,270 | * | 5/1989 | Weisenberger | 250/492.2 |
| 4,911,103 | * | 3/1990 | Davis et al. | 118/725 |
| 5,218,209 | | 6/1993 | Takeyama | 250/440.11 |
| 5,373,164 | | 12/1994 | Benveniste | 250/492.21 |
| 5,916,824 | * | 6/1999 | Mayazumi et al. | 438/753 |

FOREIGN PATENT DOCUMENTS

| 0 458 422 A2 | 11/1991 | (EP) . |
| 0 724 284 A2 | 7/1996 | (EP) . |
| WO 88/02920 | 4/1988 | (WO) . |

* cited by examiner

Primary Examiner—Jack Berman
Assistant Examiner—Nikita Wells
(74) Attorney, Agent, or Firm—Watts, Hoffmann, Fisher & Heinke, Co., L.P.A.

(57) ABSTRACT

In accordance with the present invention, an ion implanter including a rotatable support disposed in an implantation chamber of an ion beam implanter for supporting a plurality of wafer workpieces. The rotatable support includes a hub adapted to be rotated about an axis of rotation substantially parallel to a direction of an ion beam beam line entering the implantation chamber. The rotatable support further includes a plurality of wafer support members adapted to be attached to the hub, each wafer support member adapted to support at least one of the wafer workpieces. Each wafer support member includes an attachment structure for affixing the support to the rotating member and a wafer support pad extending from the attachment structure and passing through the beam line as the hub rotates. The wafer support pad includes a wafer support surface facing the beam line that includes a concave portion. Preferably, the concave portion of the wafer support surface is cylindrically shaped and a central axis of an imaginary cylinder partially formed by the concave portion intersects an axis of rotation of the hub. A radius of curvature of the concave portion is large, for a 300 mm. disk shaped wafer, the radius of curvature is 7 meters. Each wafer support member further includes a clamp for releasably securing a wafer workpiece to the wafer support pad. Upon rotation of the hub at a predetermined angular velocity, the workpiece conforms to a shape of the concave portion due to a component of centrifugal force normal to a surface of the wafer support surface.

25 Claims, 7 Drawing Sheets

ROTATABLE WORKPIECE SUPPORT INCLUDING CYCLINDRICAL WORKPIECE SUPPORT SURFACES FOR AN ION BEAM IMPLANTER

SUMMARY OF THE INVENTION

The present invention relates generally to an ion beam implanter and, more particularly, to an ion beam implanter including a rotatable workpiece support having cylindrically shaped workpiece support surfaces to minimize the variation in the angle of incidence of the ion beam across the semiconductor wafer workpieces

BACKGROUND OF THE INVENTION

Ion implantation has become the technology preferred by industry to dope semiconductor wafers with impurities in the large scale manufacture of integrated circuits. Ion dose and ion energy are the two most important variables used to define an implant step. Ion dose relates to the concentration of implanted ions for a given semiconductor material. Typically, high current implanters (generally greater than 10 milliamps (mA) ion beam current) are used for high dose implants, while medium current implanters (generally capable of up to about 1 mA beam current) are used for lower dose applications.

Ion energy is used to control junction depth in semiconductor devices. The energy levels of the ions comprising the ion beam determine the depth of implantation of the ions into the wafer workpieces. High energy processes such as those used to form retrograde wells in semiconductor devices require implants of up to a few million electron volts (MeV), while shallow junctions may only demand energies below I thousand electron volts (1 KeV).

The continuing trend to smaller and smaller semiconductor devices requires a ion beam beam line construction which serves to deliver high beam currents at low energies. The high beam current provides the necessary dosage levels, while the low energy levels permit shallow implants. Source/drain junctions in semiconductor devices, for example, require such a high current, low energy application.

In high current and high energy implanters, semiconductor wafer workpieces are mounted near the periphery of a rotatable workpiece support. As the support rotates, the workpieces pass through the ion beam and are implanted with ions. When implanting wafers, if the angle of incidence of the ion beam (implantation angle) is perpendicular or normal to the surface of the workpiece, an effect called "channeling" has been found to occur. When channeling occurs, the ions of the ion beam pass into the crystal lattice structure of the semiconductor wafers and achieve greater penetration depth than is normally the case. The effective tilt angle (ETA) is defined as the angle between the ion beam and a ray extending perpendicularly from the surface of the wafer workpieces. An ETA=0 degrees defines a channeling implantation.

If channeling not desired, the effective tilt angle ETA is increased slightly, usually in the range of 1–10 degrees so that the ion beam beam line is not exactly perpendicular to the workpiece surface. This is accomplished by tilting the workpiece support with respect to the ion beam beam line direction.

In some implantation applications, channeling is useful. However, in such channeling applications, that is, ETA=0 degrees, implantation depth is very sensitive to implantation angle variation across the workpiece. As the implantation angle varies across the workpiece, the depth of ion penetration into the semiconductor wafer workpieces changes markedly.

If implantation depth is to be accurately controlled, the implantation angle must not change significantly over the surface of the wafer. In some applications, for example, in channeling implants the maximum allowable variation in the implantation angle is 0.2 degrees.

However, current art implanters wherein the workpiece support rotates and the workpieces lie flat on a flat workpiece support pad, a variation in the implantation angle of over 1 degree with a 300 millimeter (mm.) (30 cm.) diameter wafer workpiece at an ETA=0 degrees (channeling implant) is usual.

What is needed is a wafer support apparatus that minimizes the variation of implantation angle over a range of effective tilt angles ETA from 0 degrees (channeling implantation) and greater (non channeling implantation).

SUMMARY OF THE INVENTION

The present invention concerns an ion beam implanter for treating a plurality of semiconductor wafer workpieces is disclosed. The ion implanter includes an implantation station defining an implantation chamber and further includes an ion source for generating the ion beam and beam forming and directing apparatus defining an interior region through which the ion beam passes from the ion source to the implantation station. A pump system is provided for pressurizing and depressurizing the interior region.

The implanter includes a novel rotatable support disposed in the implantation chamber for supporting a plurality of wafer workpieces. The rotatable support includes a hub adapted to be rotated about an axis of rotation substantially parallel to a direction of an ion beam beam line entering the implantation chamber. The rotatable support further includes a plurality of wafer support members adapted to be attached to the hub, each wafer support member adapted to support at least one of the wafer workpieces. Each wafer support member includes an attachment structure for affixing the support member to the hub and a wafer support pad extending from the attachment structure and passing through the beam line as the hub rotates.

The wafer support pad has a wafer support surface that includes a concave portion being concave in shape. In one preferred embodiment, the concave portion is cylindrical and a central axis of an imaginary cylinder corresponding to the cylindrically shaped concave portion passes substantially through an axis of rotation of the hub. Each wafer support member further includes a clamp for releasably securing a wafer workpiece to the wafer support pad. Upon rotation of the hub at a predetermined angular velocity, the workpiece conforms to a shape of the concave portion due to a component of centrifugal force normal to a surface of the wafer support surface.

These and other objects, features and advantages of the invention will become better understood from the detailed description of the preferred embodiments of the invention which are described in conjunction with the accompanying drawings.

DETAILED DESCRIPTION

Figure 1:
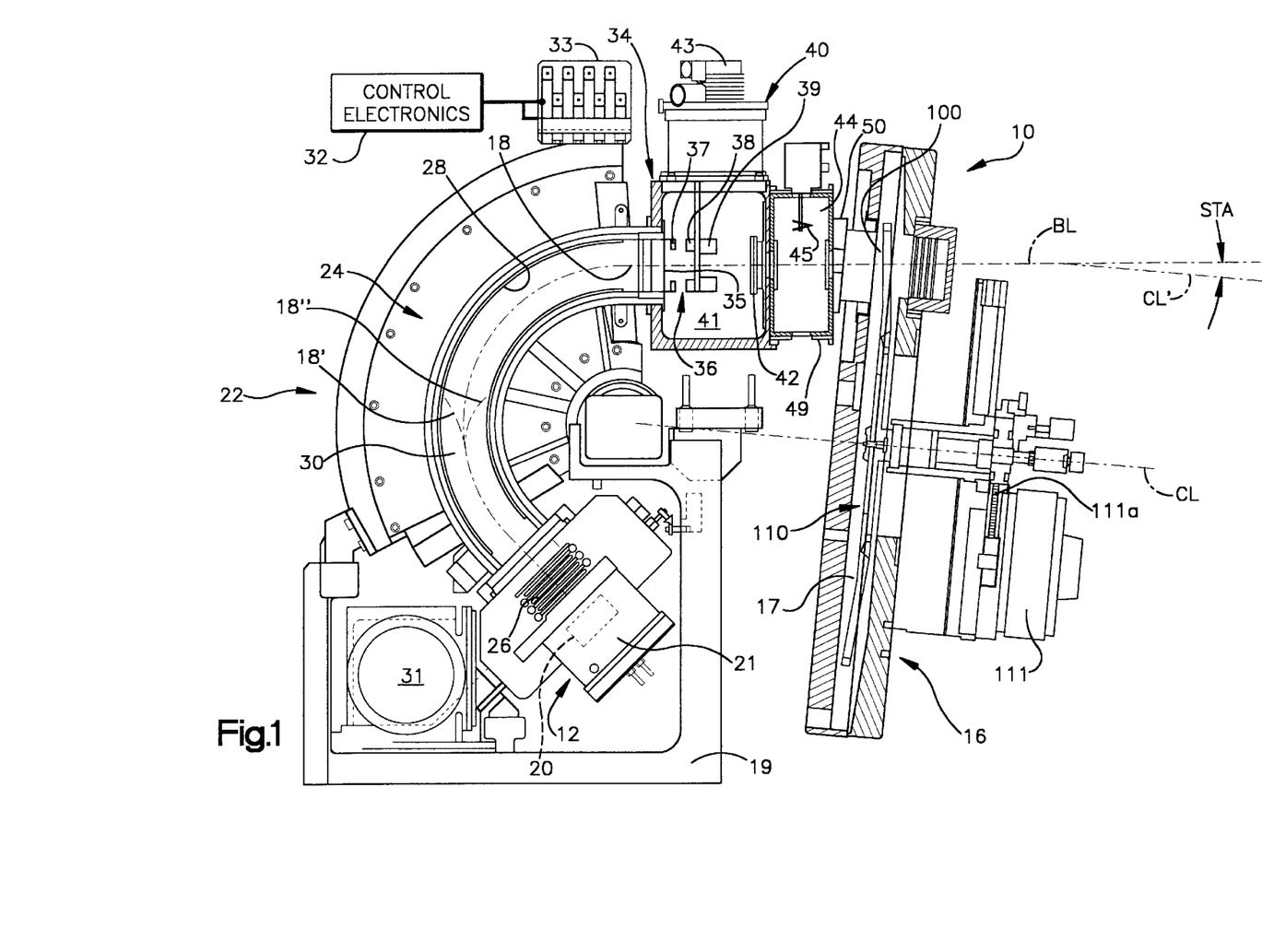
FIG. 1 is a schematic plan view of an ion beam implanter including a rotatable wafer workpiece support of the present invention.

Referring now to the drawings, an ion implanter is shown generally at 10 in FIG. 1. The specific implanter shown is a low energy ion implanter, but it should be understood that the present invention is useful and applicable to both low and high energy ion implanters, that is, ion implanters having energies anywhere in the range of 0.2 kiloelectron volts to several million volts. The ion implanter 10 includes an ion source 12, a mass analyzing magnet 24 and an implantation or end station 16. The implantation station 16 defines an implantation chamber 17. The ion source 12 generates an ion beam 18 which impacts semiconductor wafer workpieces 100 disposed on a rotating and translating disk-shaped workpiece support 110 in the implantation chamber 17.

In a low energy ion implanter, to minimize the tendency of a low energy ion beam 18 to diffuse (i.e., "blow-up") as it traverses the distance between the ion source 12 and the implantation station support 110, the distance from the ion source 12 is kept to a minimum (approximately 3 meters).

The ion source 12 is mounted to an L-shaped frame 19 and includes a housing 21 defining an interior region. The housing 21 supports a plasma arc chamber 20. The plasma arc chamber 20 defines an interior region into which source materials are injected. The source materials may include an ionizable gas or vaporized source material. Source material in solid form is deposited into a vaporizer which is then injected into the plasma chamber 28. If an n type extrinsic wafer material is desired, boron (B), gallium (Ga) or indium (In) will be used. Gallium and indium are solid source materials, while boron is injected into the plasma chamber as a gas, typically boron trifluoride ($BF_3$) or diborane ($B_2H_6$), because boron's vapor pressure is too low to result in a usable pressure by simply heating solid boron.

If a p type extrinsic material is to be produced suitable source materials include source gases arsine ($AsH_3$) and phosphine ($H_3P$) and vaporized solid antimony (Sb). Energy is applied to the source materials to generate positively charged ions in the plasma chamber 20. Generally, positive ions are generated, although the present invention is applicable to systems wherein negative ions are generated by the source. The positively charged ions exit the plasma chamber 20 through an elliptical arc slit in a cover plate overlying an open side of the plasma chamber 20.

The ion beam beam line 18 is formed and directed by beam forming and directing structure 22. The beam forming and directing structure 22 includes a mass analyzing or resolving magnet 24 and a set of extraction electrodes 26. The positive ions are extracted through a slit in the plasma chamber 20 by the set of extraction electrodes 26. The electrodes 26 are charged with negative potential voltages, increasing in magnitude as the distance from the plasma chamber slit increases. The plasma chamber ions are accelerated by the set of electrodes 26 adjacent the plasma chamber 20 into a region bounded by the mass analyzing magnet 24. An ion beam path through the magnet region is bounded by an aluminum beam guide 28. During production runs, an interior region 30 defined by the beam forming and directing structure 22 is evacuated by a pressure regulation system including a pump 31.

Ions that make up the ion beam 18 move from the ion source 12 into a magnetic field generated by the mass analyzing magnet 24. The strength and orientation of the magnetic field produced by the analyzing magnet 24 is controlled by the control electronics 32 coupled to a magnet connector 33 for adjusting a current through the magnet's field windings.

The mass analyzing magnet 24 causes only those ions having an appropriate mass to charge ratio to reach the ion implantation station 16. The ionization of source materials in the plasma chamber 20 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation. The mass analysis magnet 24 functions to pass only ions of an appropriate charge-to-mass ratio to a resolving housing 34. The magnetic field generated by the mass analyzing magnet 24 causes the ions in the ion beam 18 to move in a curved trajectory. The magnetic field that is established by the control electronics 32 is such that only ions having an atomic mass equal to the atomic mass of the desired ion species traverse the curved beam path to the implantation chamber 17. Ions that do not have the proper charge-to-mass ratios are deflected away from the beam path 18 and collide with walls of the beam guide 28 as shown by the beam paths labeled 18' and 18". The mass analysis magnet 24 includes a curved beam path which is defined by the aluminum beam guide 28. The ion beam 18 which propagates along this path is affected by the magnetic field generated by the mass analysis magnet 24. Partial focusing of the ion beam 18 by the magnet 24 is achieved in the "dispersive" plane (the plane of the curved portion of the beam path 18) only by establishing a gradient in the magnetic field (i.e., "indexing"), or by rotating the entrance or exit poles of the magnet 24. The magnetic field causes the ion beam 18 to move along the curved beam path, from a first or entrance trajectory near the ion source 12 to a second or exit trajectory near the resolving housing 34.

The entrance and exit trajectories of the ion beam 18, being in the plane of the curved beam path 29, lie in the dispersive plane. The "non-dispersive" plane is defined herein as the plane which resides perpendicular to both the dispersive plane and the target plane. Accordingly, the magnet 24 performs mass analysis in the dispersive plane by removing from the beam ions of inappropriate charge-to-mass ratio, and redirecting the beam from the entrance trajectory to the exit trajectory and toward the target plane in which the workpiece wafers 100 lie.

The beam forming and directing structure 22 includes the resolving housing 34 and a beam neutralizer or electron shower 45. The resolving housing 34 supports an electrostatic lens 36, which mass resolves and focuses the ion beam 18 output by the magnet 24. The resolving housing 34 defines a chamber 41 in which resides the electrostatic lens 36, as well as a dosimetry indicator such as a Faraday flag 42. The chamber 41 is evacuated by a vacuum pump 43 which is part of the pressure regulation system. The adjacent beam neutralizer 45 is supported within a chamber 44 defined by an ion neutralizer housing 49. The electron shower 45 neutralizes the positive charge which would otherwise accumulate on the target workpieces 100 as a result of being implanted by the positively charged ion beam 18. Such a net positive charge on a wafer workpiece has undesirable effects. The implantation station 16 is pivotable with respect to the neutralizer housing 49 and is attached to the housing 49 by a flexible bellows 50.

During a production run, that is, when semiconductor wafer workpieces 100 are being impinged upon by the ion beam 18 and thereby being implanted with ions, the ion beam 18 travels through an evacuated path from the ion source 12 to the implantation chamber 17, which is also evacuated. Evacuation of the beam path is provided by the pressure regulation system including the vacuum pumps 31, 43.

Workpiece Support 110

Supported within the implantation chamber 17 is the disk-shaped semiconductor wafer workpiece support 110. During ion beam implantation operations, the support 110 is rotated at a constant angular velocity by a motor 111 about an axis of rotation labeled CL in FIGS. 1, 14A and 14B. An output shaft of the motor 111 is coupled to a drive shaft of the support 110 via a belt. A stepper motor also drives a lead screw to translate the support 110 vertically. Ion dosage received by the workpieces 100 is determined by a combination of the velocity of the rotation and translation of the support 110 which is under the control of the control electronics 32.

The implantation station 16 is pivotable with respect to the remainder of the implanter 10. Particularly, the implantation station 16 is pivotable with respect to the ion beam beam line 18 to change a tilt angle of the support 110 and, thereby, change an angle of implantation at which the ion beam 18 strikes the workpieces 100 as the workpieces move though the beam line 18. The term STA will be used hereafter to refer to the support tilt angle, that is, the angle between the beam line 18 and the center line CL of the support 110. The portion of the beam line 18 that traverses the distance between the ion neutralizer housing 49 and the support 110 is labeled BL. As can be seen in the exaggerated schematic views of the support 110 in FIGS. 14A and 14B, the semiconductor wafer workpieces 100 are supported on wafer workpiece support surfaces 132. These wafer support surfaces 132 are disposed at a 5 degree offset angle (labeled OA FIG. 7) with respect to the generally planer surface of the support 110 (the 5 degree angle of the wafer support surfaces 132 has been exaggerated greatly in FIGS. 14A and 14B for illustrative purposes). The term ETA will be used hereafter to refer to the effective tilt angle, that is, the angle between the beam line portion BL and an imaginary line extending normal to an implantation surface of the wafer workpiece 100 being implanted. Since the wafer support surfaces 132 are at a 5 degree angle with respect to the front planar surface of the support 110, the relationship between the station tilt angle STA and the effective tilt angle ETA is given by the equation:

$$ETA=STA-5 \text{ degrees}$$

Figure 14A:
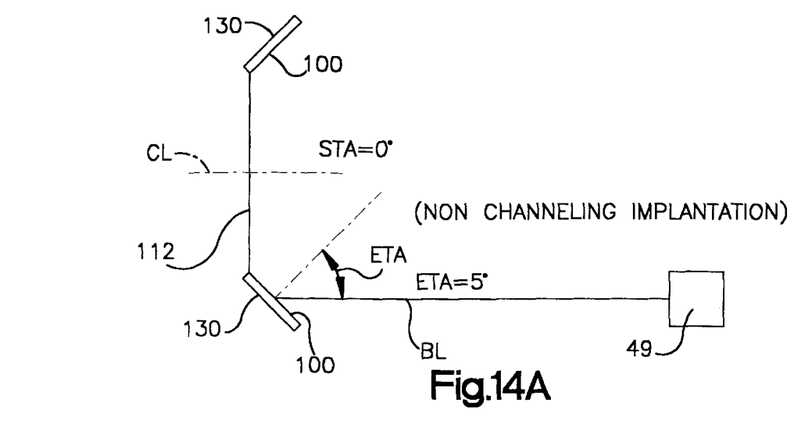
FIG. 14A is a schematic representation of the support and a semiconductor workpiece mounted on the support to illustrate the support tilt angle and the effective tilt angle for a non-channeling implantation.

FIG. 14A illustrates an non-channeling implantation wherein:

Support tilt angle=STA=0 degrees

Effective tilt angle=ETA=5 degrees

Figure 14B:
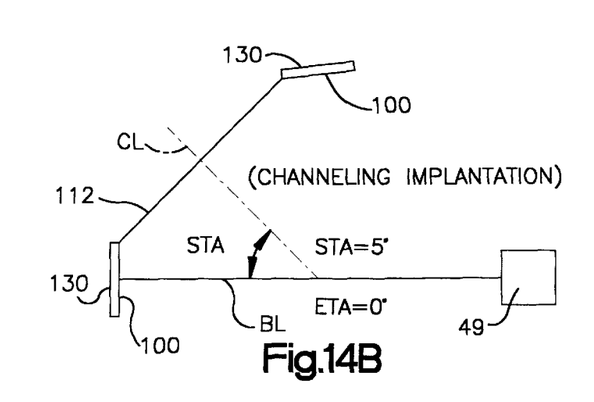
FIG. 14B is a schematic representation of the support and a semiconductor workpiece mounted on the support to illustrate the support tilt angle and the effective tilt angle for a channeling implantation.

FIG. 14B illustrates a channeling implantation wherein:

Support tilt angle=STA=5 degrees

Effective tilt angle=ETA=0 degrees

FIG. 1 illustrates a support tilt angle STA=0 degrees and an effective tilt angle ETA=5 degrees in a less exaggerated manner than FIG. 14A. For illustration purposes, a line labeled CL' which is parallel to the support axis of rotation CL is depicted in FIG. 1.

Figure 2:
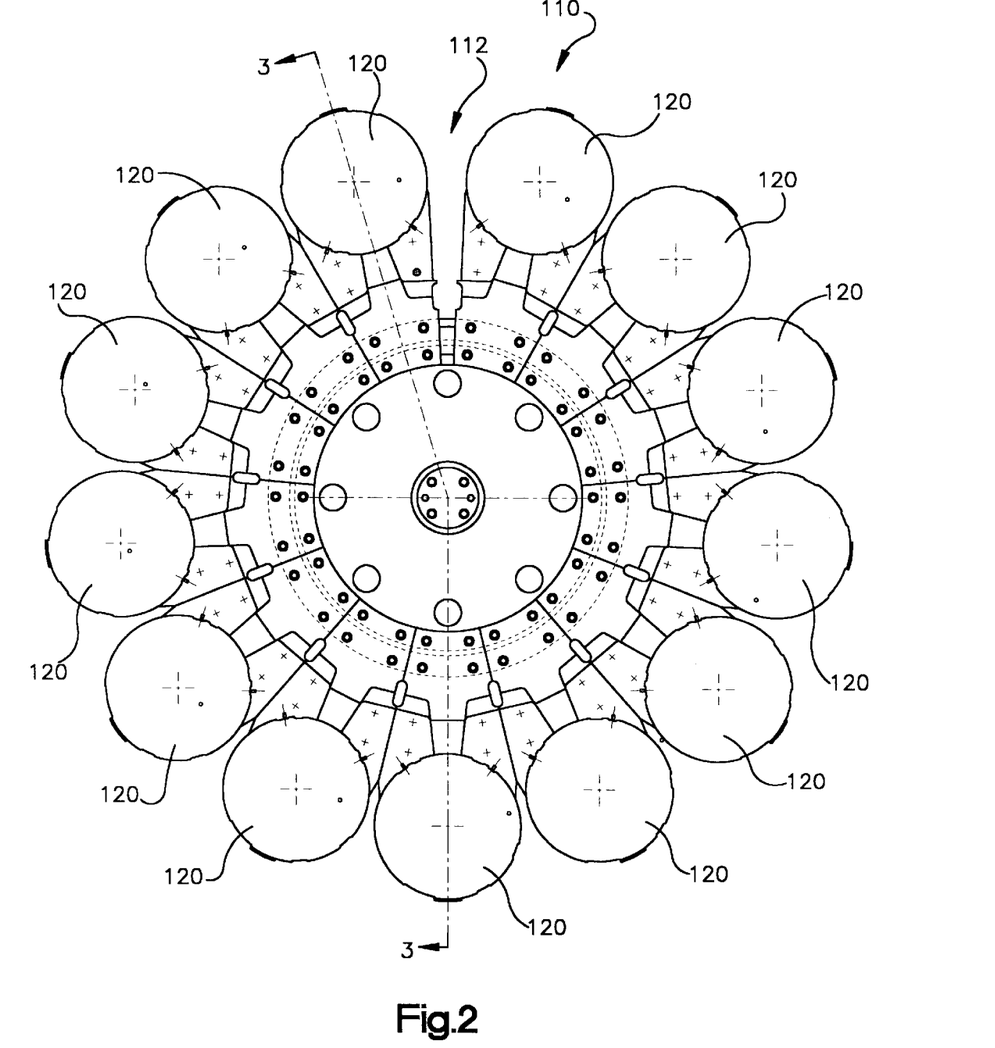
FIG. 2 is a front elevation view of the rotatable wafer workpiece support of the present invention.
Figure 3:
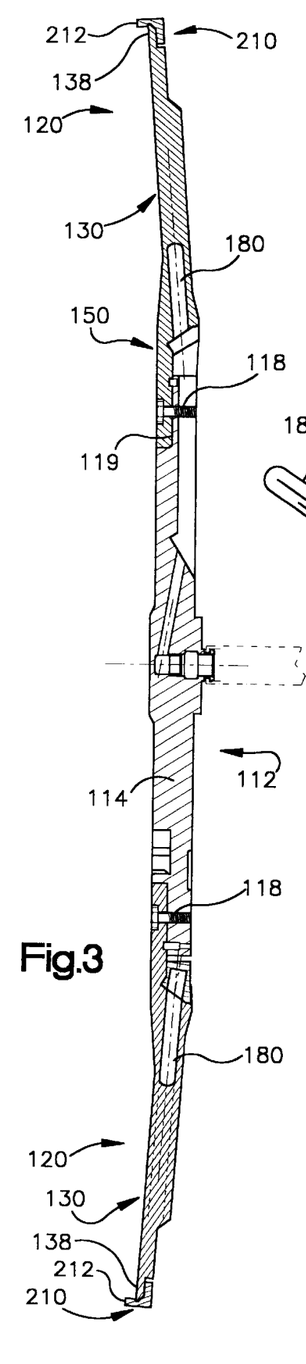
FIG. 3 is a sectional view of the rotatable support of FIG. 2 as seen from a plane indicated by the line 3—3 in FIG. 2.

As can best be seen in FIGS. 2 and 3, the support 110 includes a center disk or hub 112. Affixed to the hub 112 and extending radially outwardly from the hub are thirteen adjacently spaced wafer support members 120. Both the hub 112 and the wafer support members 120 are comprised of aluminum. Other portions of the support 110 are not shown for clarity. Each wafer support member 120 includes a wafer support pad 130 which extends from an attachment portion 150 for affixing the wafer support member to the hub 112. In the instant embodiment, each of the wafer support members 120 includes a wafer support pad 130 having a wafer support surface 132 sized to receive a 300 millimeter (mm.) (30 cm.) diameter disk-shaped semiconductor wafer workpiece 100 (workpiece 100 is shown in phantom in FIG. 5). The distance from the center axis CL of the hub 112 to the center of the 30 cm. diameter workpiece is approximately 61 centimeters (cm.).

Figure 10:
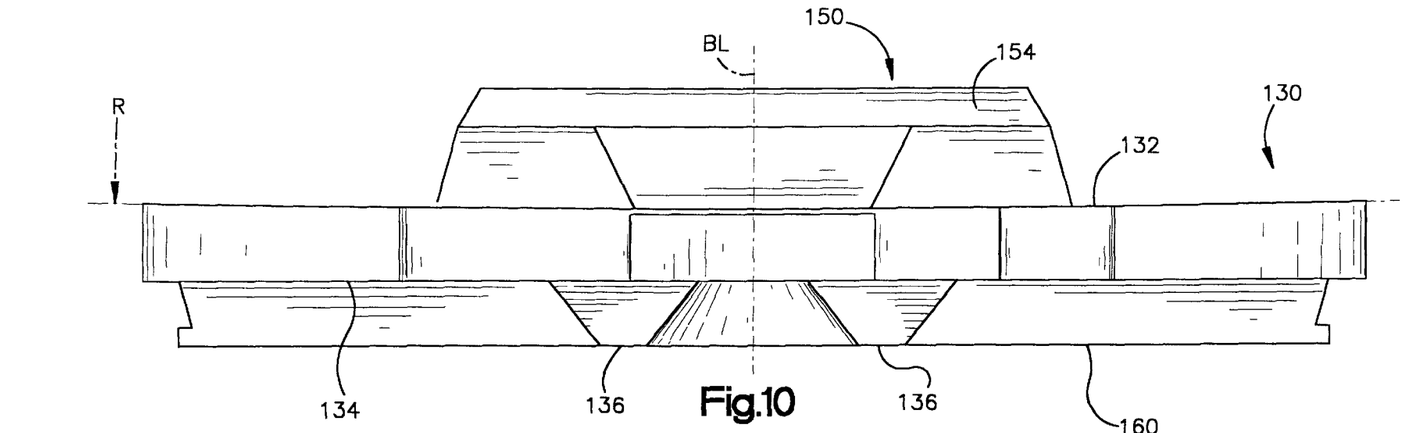
FIG. 10 is a schematic side elevation view of the wafer support member of FIG. 5.

The wafer support surface 132 is machined to have a concave surface and, specifically a cylindrically-shaped concave surface (best seen in FIG. 10). The surface 132 faces in the direction of the ion beam 18 as it enters the implantation chamber and is concave with respect to the direction of the ion beam 18. The concave wafer support surface 132 forms a portion of an outer wall of an imaginary cylinder IC (partially shown in dashed line in FIGS. 11B, 11C, and 11D) having a radius of curvature R (FIGS. 10, 11B, 11C, and 11D) of approximately 7 meters.

A central axis of the imaginary cylinder IC passes through the axis of rotation CL of the hub 112. For implanting disk shaped wafer workpieces having a 20 cm. diameter, the wafer support members would be modified to have a 20 cm. diameter wafer support surface. With a 45 cm. radius to the center of the workpiece 100 and a 5 degree support surface angle, the support surface would be machined to have a radius of curvature of 5.12 meters.

Figure 8:
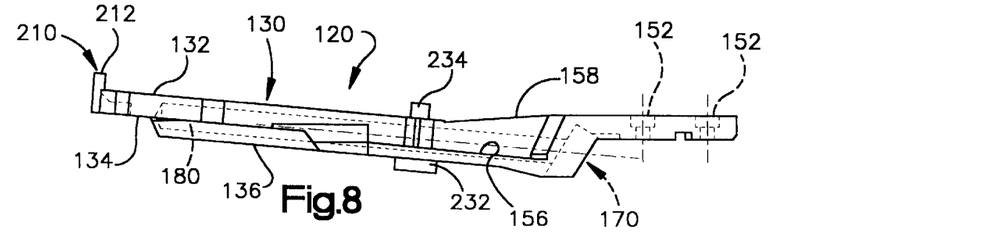
FIG. 8 is a side elevation view of the wafer support member of FIG. 5 as seen from a plane indicated by the line 8—8 in FIG. 5.

Each wafer support member 120 is affixed to the central portion 114 of the hub 112 by four bolts 118. The bolts 118 fit into counterbored openings 152 (FIG. 8) in a flat peripheral portion 154 (FIG. 5) of the attachment portion 150 and extend through aligned threaded openings in the hub 112. As can be seen in FIG. 3, the flat peripheral portion 154 of the attachment portion 150 seats against a recessed outer portion 119 of the hub 112.

Figure 5:
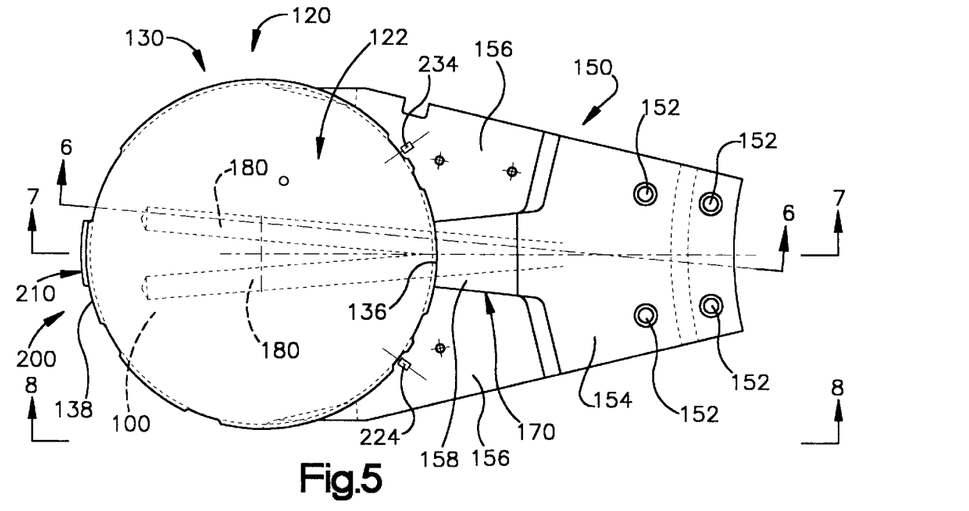
FIG. 5 is a front elevation view of a wafer support member of the rotatable support of FIG. 2.
Figure 6:
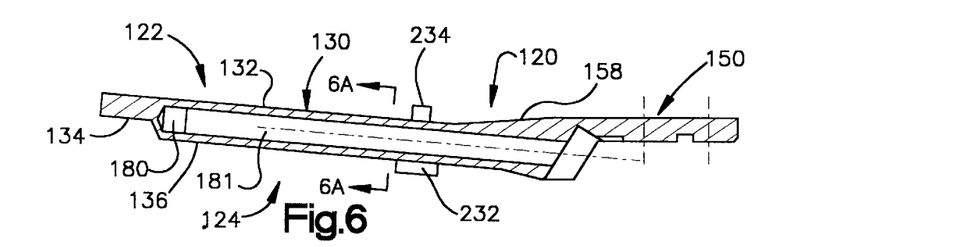
FIG. 6 is a sectional view of the wafer support member of FIG. 5 as seen from a plane indicated by the line 6—6 in FIG. 5.
Figures 9, 11A:
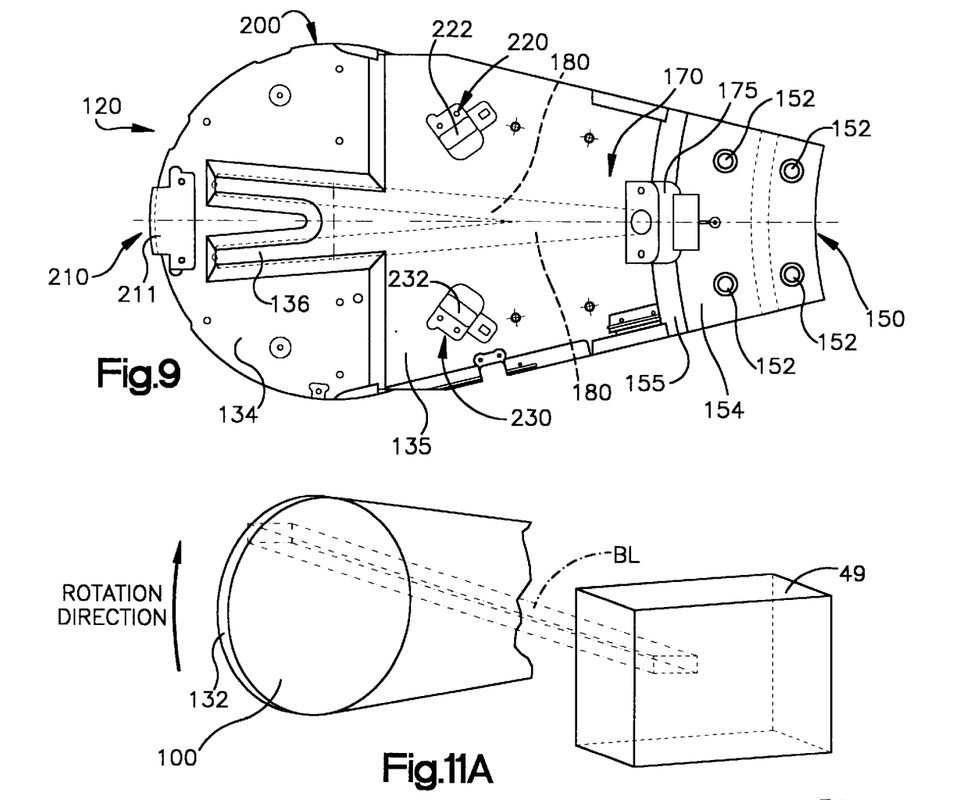
FIG. 9 is a back elevation view of the wafer support member of FIG. 5.
FIG. 11A is a schematic depiction of an ion beam beam line impinging upon an upper portion of a wafer workpiece supported on a cylindrically curved support.

An upper surface 122 of the wafer support member 120 is best seen in FIG. 5. Extending between the wafer support surface 132 and the flat peripheral portion 154 are a pair of thinner recessed portions 156 flanking a thicker raised center portion 158. The raised center portion 158 terminates at an inner periphery 136 (FIG. 5) of the wafer support surface 132. A lower surface 124 of the wafer support member is best seen in FIG. 9. Extending downwardly from the flat peripheral portion 152 of the attachment portion 152 and a flat bottom surface 134 of the support pad 130 is a central portion 135. As can best be seen in FIGS. 5, 6 and 9, the central portion 135 provides a path for a pair of cooling channels 180 extending through an interior region of the wafer support member 120. The channels 180 are angled and have a common vertex. As can be seen in FIG. 9, the downwardly extending central portion 135 terminates in a V-shaped portion 136 under the support surface 132. The channels 180 are part of a cooling structure 170 of the wafer support member 120.

Figure 6A:
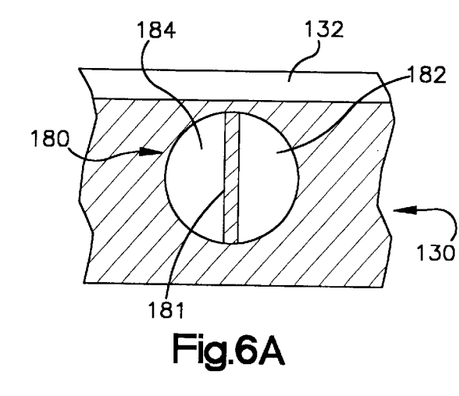
FIG. 6A is a section view of the wafer support member of FIG. 5 as seen from a plane indicated by the line 6A—6A in FIG. 6.

As can best be seen in FIG. 6A a divider 181 is disposed in each channel 180 terminating short of a distal end of each channel (see FIG. 6) such that the channel provides a cooling liquid inflow path 182 and an outflow path 184 for routing coolant in proximity to a workpiece support surface 132 of the pad 130. The preferred cooling fluid is water or, preferably, deionized water.

Figure 4:
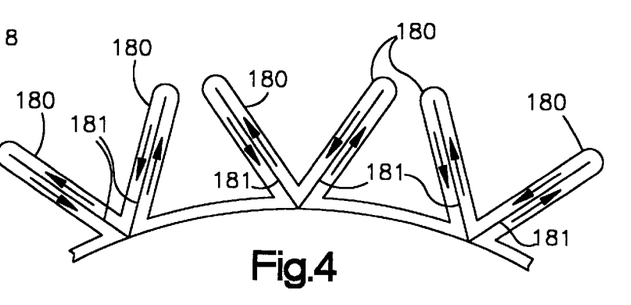
FIG. 4 is a schematic depiction of a portion of a cooling structure for the rotatable support of FIG. 2.

The channels 180 terminate at a vertex in a fluid coupling 175 (only shown in FIG. 9) seated against an inclined portion 155 transitioning between flat peripheral portion 152 and the downwardly extending central portion 135. The coupling 175 mates with an "o" ring on the hub 112 to seal against cooling fluid leakage. Shown schematically in FIG. 4 is a representation of the "daisy chain" flow of coolant through three of the support members 120 and the hub 112.

The workpiece 100 is held in place on the wafer support surface 132 by a workpiece clamping assembly 200 including three spring loaded clamps: a peripheral clamp 210 disposed on a distal peripheral portion 138 of the support pad 130 and two interior clamps 220, 230 disposed on an inner periphery 136 of the support pad 130 spaced outwardly and equidistantly from the intersection of the support pad and the raised portion 158 (FIG. 5). The peripheral clamp 210 includes a base 211 (FIG. 9) affixed to the bottom support pad surface 134 and a spring loaded clamping member 212 extending above the support surface 132 at the distal peripheral portion 138 to push radially inwardly on the circular shaped workpiece 100. The interior clamps 220, 230 include respective bases 222, 232 affixed to the downwardly extending portion 135. Portions of the clamps 220, 230 extend upward through small holes in the thin portions 156 and are disposed adjacent slight indentations in the support surface periphery (best seen in FIG. 5). Spring loaded clamping members 224, 234 of the clamps 220, 230 extend above the support surface 132 to push radially inwardly on the workpiece 100. It should be noted that when the support 110 is rotating during a production run at approximately 1200 revolutions per minute, the interior clamps 220, 230 are no longer needed to hold the workpiece in place as centrifugal force pushes the workpiece outwardly against the peripheral clamp 210. However, in the present embodiment the clamps are left in place, clamping the workpiece 100.

Figure 7:
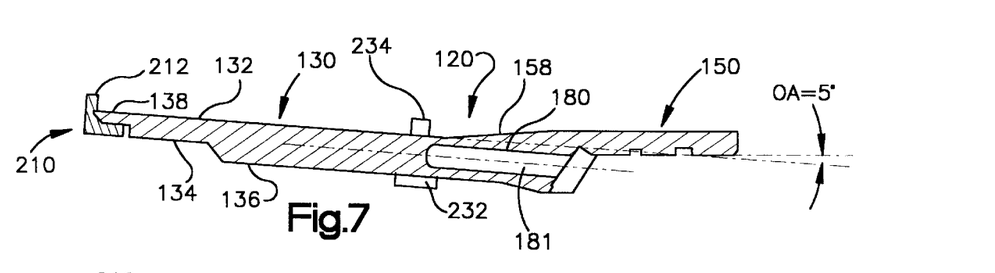
FIG. 7 is another sectional view of the wafer support member of FIG. 5 as seen from a plane indicated by the line 7—7 in FIG. 5.

As can be seen in FIG. 7, there is an offset angle, OA, of 5 degrees between the flat attachment portion 150 attached to the hub central portion 114 and the workpiece support surface 132.

Figure 11B:
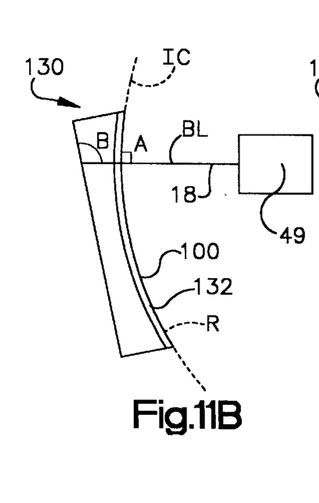
FIG. 11B is a two dimension schematic representation of the depiction of FIG. 11B.
Figure 11C:
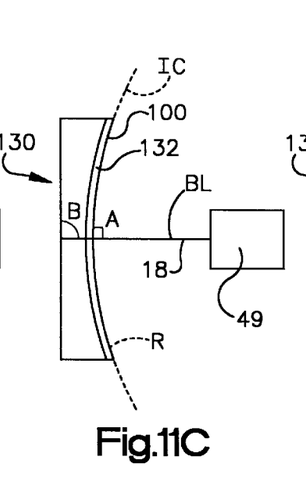
FIG. 11C is a two dimensional schematic representation of an ion beam beam line impinging upon a central portion of the cylindrically curved workpiece of FIG. 11A.
Figure 11D:
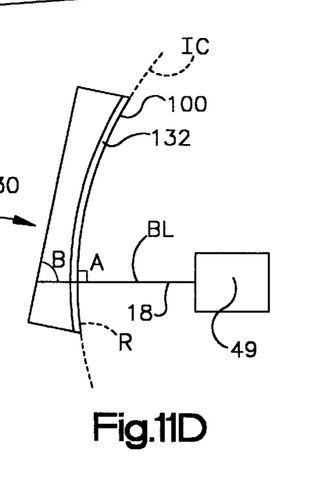
FIG. 11D is a two dimensional schematic representation of an ion beam beam line impinging upon a lower portion of the cylindrically curved workpiece of FIG. 11A.

The cylindrical shape of the workpiece support surface 132 is shown in FIGS. 10, 11A, 11B, 11C and 11D. As the support 110 rotates, the centrifugal force acting on the workpiece 100 bends the workpiece to make it conform to the cylindrical shape of the support surface 132. Because the support surface 132 is at an angle with respect to the axis of rotation CL of the support 110, a component of the outward centrifugal force acts on the workpiece 100 pushing the workpiece flush against the support surface 132. In FIGS. 11A, 11B, 11C and 11D, the radius of curvature of the support surface 132 is greatly exaggerated to illustrate the principle that the curvature of the support surface 132 causes the rectangular shaped ion beam BL exiting the ion neutralizer housing 49 to have an angle of implantation A (that is, the angle of incidence of the ion beam 18 on the workpiece) that is substantially perpendicular to the workpiece implantation surface. As can be seen in FIGS. 11B, 11C and 11D, as the support 110 rotates and the workpiece 100 passes through the beam line BL, the implantation angle A remains at 90 degrees, whereas, if the workpiece was flat, the angle of implantation would change markedly as the workpiece passes through the beam line BL. The variation of implantation angle if the workpiece 100 were supported on a flat surface is shown by the angle labeled B in FIGS. 11B, 11C and 11D. As will be explained below, there is some variation of the implantation angle for the cylindrically shaped wafer support surface 132 of the present invention, but, under a range of tilt angles, the implantation angle variation is less than 0.2 degrees which is a marked improvement over the implantation angle variation of a flat wafer support surface for a range of tilt angles.

Figure 12:
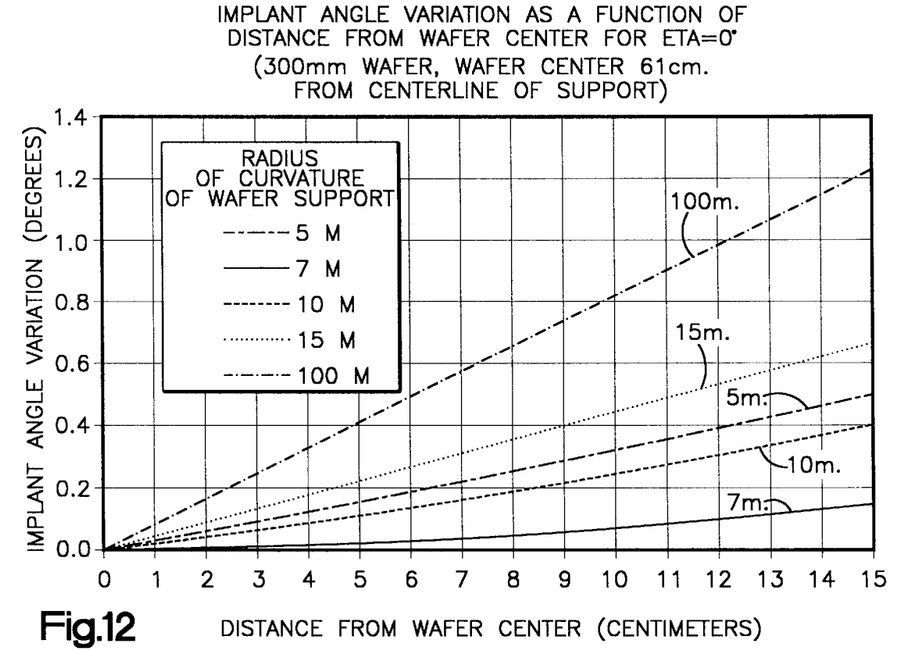
FIG. 12 is a graph showing ion beam implant angle variation as a function of a distance from the wafer center for five different radii of curvature.

For channeling implantation, ETA=0 degrees, a radius of curvature of R=7 meters provides for less that 0.2 degrees of implant angle variation across a 30 cm. (300 mm.) wafer workpiece 100 wherein the center of the workpiece 100 is 61 cm. from the rotational center line CL of the rotatable support 120. FIG. 12 shows the implant angle variation across a 30 cm. diameter (radius of 15 cm.) wafer workpiece for cylindrical radii of curvature varying from 5 meters to 100 meters. Note that the limit of the horizontal axis is 15 cm. which corresponds to the outer edge of the 30 cm. diameter circular workpiece 100. The 100 meter radius of curvature is so large that it can be viewed as an approximation of a flat wafer workpiece, that is, a workpiece on a flat wafer support surface. As can be seen, the minimum variation occurs for a radius of curvature of 7 meters (275.6"). For an effective tilt angle ETA=0 degrees, the maximum implant angle variation for the R=7 meter radius cylindrical support surface 132 is only 0.15 degrees. For the 100 meter radius of curvature, which approximates prior art flat workpiece support surfaces, the implant angle variation is 1.2 degrees for a 30 cm. diameter workpiece.

Since the pressure to deflect the wafers into the pad is much less than the available centrifugal pressure, performance of the cooling structure 170 is substantially unaffected, that is, sufficient coolant flows through the channels 180 to provide cooling at acceptable coolant pressure levels. Stress on the wafer workpiece 100 is well within acceptable limits, being only about 4% of the minimum breaking stress. The imaginary central axis of a cylinder that includes the cylindrical support surface 132 and passes through the rotatable support axis of rotation CL.

Figure 13:
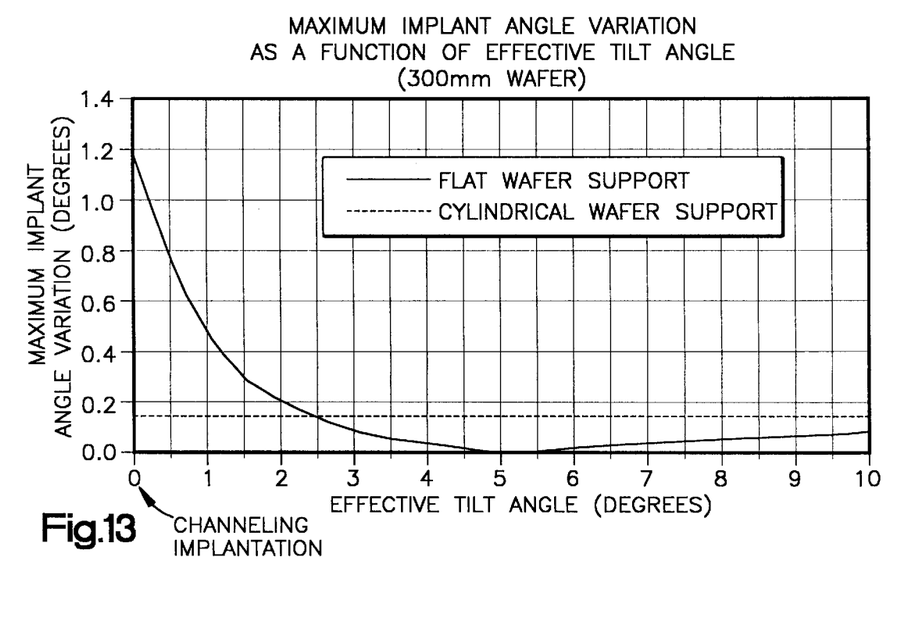
FIG. 13 is a graph showing maximum ion beam implant angle variation as a function of tilt angle for a flat wafer support pad surface and a cylindrically curved wafer support pad surface having a radius of curvature of 7 meters.

FIG. 13 shows the maximum implant angle variation as a function of the effective tilt angle, ETA, for a flat wafer support surface and for the wafer support surface 132 of the present invention having a radius of curvature, R=7 meters. As can be seen in FIG. 13, in a channeling implantation, ETA=0 degrees, for a flat wafer support surface, the maximum variation of implantation angle has been determined to be 1.2 degrees across the 30 cm. wafer workpiece 100. This implantation angle variation is unacceptably large for channeling implantations, where minimizing implantation angle variation is especially critical. For the cylindrical wafer support surface 132 having a radius of curvature R=7 meters, the maximum variation of implantation angle is a nearly constant value just less than 0.2 degrees across the 30 cm. wafer workpiece for a range of effective tilt angles ETA from 0 degrees to +10 degrees.

A flat workpiece support surface provides a constant implant angle when the beam is parallel to the rotation axis, thus, the maximum variation in implantation angle is essentially zero at an ETA=5 degrees. At all other implant angles the implantation variation is non-zero. The maximum implant angle variation occurs at ETA=0 degrees. In contrast, the cylindrical surface 132 of the present invention provides a maximum implant variation that is more or less constant over the range of interest.

It should be recognized that, while the cylindrically shaped concave workpiece support surface 132 provides an acceptable maximum implantation angle variation over a range of utilized tilt angles, TA, there exist other non-cylindrically shaped concave support surfaces that will provide even lower maximum implantation angle variation over certain ranges of tilt angles. It is the intent of the present invention to cover all such concave workpiece support surfaces, in addition, to the cylindrically shaped support surface 132 specifically disclosed. The advantage of the cylindrically shaped surface is that such a cylindrical surface is easier to machine than more complex concave surfaces while still providing acceptable maximum implantation angle variation over a robust range of tilt angles. Additionally, the force required to deform the wafer workpieces 100 to such non-cylindrically shaped concave support surfaces will be greater, thereby decreasing contact pressure between the workpiece and the workpiece support. With most commonly employed workpiece cooling schemes currently in use, this will also decrease the workpiece cooling.

While the invention has been described herein in its currently preferred embodiment or embodiments, those skilled in the art will recognize that other modifications may be made without departing from the invention and it is intended to claim all modifications and variations as fall within the scope of the invention.

What is claimed is:

1. In an ion implanter, a rotatable support disposed in an implantation chamber for supporting a plurality of wafer workpieces, the rotatable support comprising:
   a) a plurality of wafer support members adapted to be attached to the support, each wafer support member adapted to support at least one of the plurality of wafer workpieces and including a wafer support pad positioned to pass through the beam line as the support rotates, each wafer support pad having wafer support surface facing the beam line entering the implantation chamber, each wafer support surface being offset at an angle with respect to an axis of rotation of the support and including a concave portion; and
   b) for each of the plurality of wafer support members, a support structure for supporting a wafer workpiece on the wafer support pad wherein upon rotation of the support at a predetermined angular velocity, each of the wafer workpieces conforms to a shape of the concave portion of its associated wafer support surface due to a component of an outward centrifugal force urging each of wafer workpieces against its associated wafer support surface, the outward centrifugal force resulting from rotation of the support.

2. The rotatable support of claim 1 wherein each of the plurality of wafer support members includes an attachment structure for affixing the support member to the support and the wafer support pad extends from the attachment structure.

3. The rotatable support of claim 1 wherein for each of the plurality of wafer support members, the concave portion is cylindrically shaped.

4. The rotatable support of claim 3 wherein for each of the plurality of wafer support members, a central axis of an imaginary cylinder corresponding to the cylindrically shaped concave portion passes through the axis of rotation of the rotatable support.

5. The rotatable support of claim 1 wherein for each of the plurality of wafer support members, the support structure includes a clamp for releasably securing a wafer workpiece to the wafer support pad.

6. The rotatable support of claim 1 wherein for each of the plurality of wafer support members, a radius of curvature of the concave portion of the wafer support surface is substantially equal to the distance along a perpendicular to a center of the wafer support member to the axis of rotation of the support.

7. The rotatable support of claim 1 wherein the rotatable support is pivotable with respect to an ion beam beam line of the ion implanter.

8. The rotatable support of claim 1 wherein the offset angle between each wafer support surface and the axis of rotation of the support is substantially five degrees.

9. A rotatable support disposed in an implantation chamber of an ion beam implanter for supporting a plurality of wafer workpieces, the rotatable support comprising:
   a) a hub adapted to be rotated about an axis of rotation substantially parallel to a direction of an ion beam beam line entering the implantation chamber; and
   b) a plurality of wafer support members adapted to be attached to the hub, each wafer support member adapted to support at least one of the plurality of wafer workpieces and including:
      1) attachment structure for affixing the support to the hub;
      2) a wafer support pad extending from the attachment structure and passing through the beam line as the hub rotates, the wafer support pad having a wafer support surface facing the ion beam beam line entering the implantation chamber, the wafer support surface being offset at an angle with respect to the axis of rotation of the hub and including a concave portion; and    3) upon rotation of the hub at a predetermined angular velocity, the at least one workpiece conforming to a shape of the concave portion of the wafer support surface due to a component of an outward centrifugal force urging the at least one workpiece against the wafer support surface, the outward centrifugal force resulting from rotation of the hub.

10. The rotatable support of claim 9 wherein for each of the plurality of wafer support members, the concave portion is cylindrically shaped.

11. The rotatable support of claim 10 wherein for each of the plurality of wafer support members, a central axis of an imaginary cylinder corresponding to the cylindrically shaped concave portion passes through the axis of rotation of the hub.

12. The rotatable support of claim 9 wherein the hub is pivotable with respect to the ion beam beam line.

13. The rotatable support of claim 9 wherein the offset angle between the wafer support surface and the axis of rotation of the hub is substantially five degrees.

14. An ion beam implanter for directing an ion beam against a plurality of wafer workpieces, the implanter comprising:

a) an implantation station defining an implantation chamber, the plurality of workpieces supported within the implantation chamber;

b) an ion source generating the ion beam, the ion beam traversing a beam line extending from the ion source to the implantation chamber; and   c) a rotatable support disposed in the implantation chamber for supporting the plurality of wafer workpieces, the rotatable support including:

1) a plurality of wafer support members adapted to be attached to the support, each wafer support member adapted to support at least one of the plurality of wafer workpieces and including a wafer support pad positioned to pass through the beam line as the support rotates, each wafer support pad having wafer support surface that is offset at an angle with respect to an axis of rotation of the support and includes a concave portion that is concave with respect to the direction of the ion beam entering the implantation chamber; and   upon rotation of the support at a predetermined angular velocity, each of the wafer workpieces conforms to a shape of the concave portion of its associated wafer support surface due to a component of an outward centrifugal force urging each of the wafer workpieces against its associated wafer support surface, the outward centrifugal force resulting from rotation of the support.

15. The ion beam implanter of claim 14 wherein each of the plurality of wafer support members includes an attachment structure for affixing the support member to the support and the wafer support pad extends from the attachment structure.

16. The ion beam implanter of claim 14 wherein for each of the plurality of wafer support members, the concave portion is cylindrically shaped.

17. The ion beam implanter of claim 16 wherein for each of the plurality of wafer support members, a central axis of an imaginary cylinder corresponding to the cylindrically shaped concave portion passes through the axis of rotation of the rotatable support.

18. The ion beam implanter of claim 14 wherein for each of the plurality of wafer support members, a radius of curvature of the concave portion of the wafer support pad is substantially equal to the distance along a perpendicular to a center of the wafer support member to the axis of rotation of the support.

19. The ion beam implanter of claim 14 wherein the rotatable support is pivotable with respect to the ion beam beam line.

20. The ion beam implanter of claim 14 wherein the offset angle between each wafer support surface and the axis of rotation of the support is substantially five degrees.

21. A method of rotatably supporting a plurality of wafer workpieces in an implantation chamber of an ion beam implanter for implantation by ions traversing an ion beam beam line, the steps of the method comprising:

a) providing a rotatable support including:

1) a plurality of wafer support members adapted to be attached to the rotatable support, each wafer support member adapted to support at least one of the plurality of wafer workpieces and including a wafer support pad positioned to pass through the ion beam beam line as the support rotates, each wafer support pad having wafer support surface facing the beam line that is offset at an angle with respect to an axis of rotation of the support and includes a concave portion; and    2) for each of the plurality of wafer support members, a clamp for releasably securing a wafer workpiece to each wafer support pad wherein upon rotation of the support at a predetermined angular velocity each of the wafer workpieces conforms to a shape of the concave portion of its associated wafer support pad surface due to a component of an outward centrifugal force urging each of the wafer workpieces against its associated wafer support surface, the outward centrifugal force resulting from rotation of the support;

b) affixing each of the plurality of wafer workpieces to respective different one of the plurality of wafer support members; and   c) rotating the rotatable support at the predetermined angular velocity.

22. The method of claim 21 wherein for each of the plurality of wafer support members, the concave portion of the wafer support surface is cylindrically shaped.

23. The method of claim 22 wherein for each of the plurality of wafer support members, a central axis of an imaginary cylinder corresponding to the cylindrically shaped concave portion intersects the axis of rotation of the rotatable support.

24. The method of claim of claim 22 wherein for each of the plurality of wafer support members, a radius of curvature of the concave portion of the wafer support pad is substantially equal to the distance along a perpendicular to a center of the wafer support member to the axis of rotation of the support.

25. The method of claim 21 wherein the offset angle between each wafer support surface and the axis of rotation of the hub is substantially five degrees.

\* \* \* \* \*